United States Patent
Qin

(10) Patent No.: US 10,141,351 B2
(45) Date of Patent: Nov. 27, 2018

(54) ARRAY SUBSTRATE, DISPLAY DEVICE AND MANUFACTURING METHOD FOR ARRAY SUBSTRATE

(71) Applicant: Wuhan China Star Optoelectronics Technology Co., Ltd., Wuhan, Hubei (CN)

(72) Inventor: Fang Qin, Guangdong (CN)

(73) Assignee: Wuhan China Star Optoelectronics Technology Co., Ltd, Wuhan, Hubei (CN)

( * ) Notice: Subject to any disclaimer, the term of this patent is extended or adjusted under 35 U.S.C. 154(b) by 161 days.

(21) Appl. No.: 15/113,410

(22) PCT Filed: Jun. 21, 2016

(86) PCT No.: PCT/CN2016/086637
§ 371 (c)(1),
(2) Date: Jul. 21, 2016

(87) PCT Pub. No.: WO2017/206208
PCT Pub. Date: Dec. 7, 2017

(65) Prior Publication Data
US 2018/0175078 A1    Jun. 21, 2018

(30) Foreign Application Priority Data
May 31, 2016    (CN) .......................... 2016 1 0375303

(51) Int. Cl.
*H01L 27/12*    (2006.01)
*H01L 21/84*    (2006.01)
*H01L 27/32*    (2006.01)

(52) U.S. Cl.
CPC .......... *H01L 27/1262* (2013.01); *H01L 21/84* (2013.01); *H01L 27/12* (2013.01);
(Continued)

(58) Field of Classification Search
CPC . H01L 27/12; H01L 27/1262; H01L 27/1218; H01L 27/3258
See application file for complete search history.

(56) References Cited

U.S. PATENT DOCUMENTS 6,756,641 B2 * 6/2004 Lu ...................... H01L 27/3244
257/350
9,780,212 B2 * 10/2017 Singh .................... H01L 29/785
(Continued)

FOREIGN PATENT DOCUMENTS

CN    103681869 A    3/2014
CN    103730364 A    4/2014
(Continued)

*Primary Examiner* — Phuc T Dang
(74) *Attorney, Agent, or Firm* — Andrew C. Cheng

(57) ABSTRACT

An array substrate is disclosed. The array substrate includes: a substrate adopting an organic material; an isolation layer adopting a metal material, and the isolation layer is formed on the substrate; and a buffering layer formed at a side of the isolation layer away from the substrate. In the array substrate of the present invention, in a high-temperature PECVD process, a pollution problem caused by the plasma directly bombarding the substrate made of an organic material can be avoid. A display device applying the array substrate and a manufacturing method for an array substrate are also disclosed.

6 Claims, 3 Drawing Sheets

(52) U.S. Cl.
CPC .......... *H01L 27/1218* (2013.01); *H01L 27/32* (2013.01); *H01L 27/3258* (2013.01); *H01L 2227/323* (2013.01)

(56) References Cited

U.S. PATENT DOCUMENTS

| | | |
|---|---|---|
| 2006/0138922 A1 | 6/2006 | Kim et al. |
| 2007/0002201 A1 | 1/2007 | You |
| 2014/0327010 A1* | 11/2014 | Pendharkar ......... H01L 27/0255 257/76 |
| 2014/0374703 A1 | 12/2014 | Jung |
| 2015/0086794 A1* | 3/2015 | Akita ...................... B32B 17/06 428/427 |
| 2015/0214373 A1* | 7/2015 | Zhang ................. H01L 29/7869 257/72 |
| 2016/0071887 A1* | 3/2016 | Chao ................... H01L 27/1222 257/72 |

FOREIGN PATENT DOCUMENTS

| | | |
|---|---|---|
| CN | 104779199 A | 7/2015 |
| CN | 105355544 A | 2/2016 |

\* cited by examiner

ARRAY SUBSTRATE, DISPLAY DEVICE AND MANUFACTURING METHOD FOR ARRAY SUBSTRATE

CROSS REFERENCE

The claims of this application have submitted to the State Intellectual Property Office of the People's Republic of China (SIPO) on May 31, 2016, Application No. 201610375303.0. The priority right based on the China application has a title of "Array substrate, display device and manufacturing method for array substrate". The entire contents of the above-mentioned patent application will be incorporated in the present application through citing.

FIELD OF THE INVENTION

The present invention relates to a flexible display technology field, and more particularly to an array substrate, a display device and a manufacturing method for an array substrate.

BACKGROUND OF THE INVENTION

The conventional flexible display device is based on an organic material substrate. Because water isolation, oxygen barrier, and heat resistance abilities of the organic material substrate are poor, and when manufacturing a Low temperature poly-silicon (LTPS) flexible display device, a high-temperature process such as the Eximer laser annealing (ELA) is required. Accordingly, a thicker layer of nitride material or oxide material on the substrate is required as a buffering layer in order to avoid the organic material substrate from damaging. The buffering layer made of the nitride material or oxide material is generally deposited through a Plasma Enhanced Chemical Vapor Deposition (PECVD) method. The buffering layer deposited through a low-temperature deposition is loose in structure and has poor effects in water isolation and oxygen barrier. When depositing through a higher temperature, in the deposition process, the plasma bombards the organic material substrate directly such that an organic dust will pollute the device cavity and the pipeline.

SUMMARY OF THE INVENTION

The technology solved by the present invention is to provide an array substrate, in the PECVD process, a pollution problem caused by the plasma directly bombarding the substrate made of an organic material can be avoid.

Furthermore, the present invention also provides a display device applying the array substrate.

Furthermore the present invention also provides a manufacturing method for an array substrate in order to manufacture the array substrate.

In order to realize the above purpose, the embodiment of the present invention adopts a following solution: an array substrate, comprising:

a substrate adopting an organic material;

an isolation layer adopting a metal material, and the isolation layer is formed on the substrate; and a buffering layer formed at a side of the isolation layer away from the substrate.

Wherein, the array substrate further includes multiple thin-film transistors, the multiple thin-film transistors are formed at a side of the buffering layer back to the isolation layer, and each of the multiple thin-film transistors includes a low-temperature polysilicon layer.

Wherein, the isolation layer adopts a titanium material.

Wherein, the isolation layer adopts an aluminum material, a copper material or a nickel material.

On the other hand, the present invention also provides a display device, comprising an organic light emitting diode and an array substrate as described above, the organic light emitting diode is formed at a side of the buffering layer back to the isolation layer.

On the other hand, the present invention also provides a manufacturing method for an array substrate, comprising:

providing a substrate, and the substrate adopts an organic material;

forming an isolation layer on the substrate, and the isolation layer adopts a metal material;

forming a buffering layer at a side of the isolation layer back to the substrate; and forming multiple thin-film transistors on a side of the buffering layer back to the isolation layer.

Wherein, the step of forming an isolation layer on the substrate comprises: depositing a titanium material on the substrate in order to form the isolation layer.

Wherein, the step of depositing a titanium material on the substrate comprises: a process temperature for depositing the titanium material on the substrate is less than or equal to 250°.

Wherein, the step of depositing a titanium material on the substrate comprises: through a magnetron sputtering to deposit the titanium material on the substrate.

Wherein, the step of forming an isolation layer on the substrate comprises: depositing an aluminum material, a copper material or a nickel material on the substrate in order to form the isolation layer.

Comparing to the conventional art, the present invention has following beneficial effects:

In the present embodiment, because in the array substrate, the isolation layer is disposed between the array substrate and the buffering layer, and the isolation layer adopts a metal material, in the process of manufacturing the buffering layer through a high-temperature Plasma Enhanced Chemical Vapor Deposition (PECVD), the isolation layer can prevent an organic material generated by the substrate when the plasma bombard the substrate directly from polluting the cavity and pipe of the device. At the same time, in a subsequent high temperature process such as an excimer laser crystallization process, the isolation layer can also decrease a heat conduction from an external environment to the substrate so as to protect the substrate.

BRIEF DESCRIPTION OF THE DRAWINGS

In order to more clearly illustrate the technical solution in the present invention or in the prior art, the following will illustrate the figures used for describing the embodiments or the prior art. It is obvious that the following figures are only some embodiments of the present invention. For the person of ordinary skill in the art without creative effort, it can also obtain other figures according to these figures.

DETAILED DESCRIPTION OF THE PREFERRED EMBODIMENT

The following content combines with the drawings and the embodiment for describing the present invention in detail. It is obvious that the following embodiments are only some embodiments of the present invention. For the person of ordinary skill in the art without creative effort, the other embodiments obtained thereby are still covered by the present invention.

Besides, the description of the following embodiments is referred to the appended figures in order to exemplarily illustrate the specific embodiments of the present invention. The directional terms mentioned in the present invention such as "up", "down", "front", "rear", "left", "right", "inside", "outside", "side surface" and so on only refer to the direction of appended figures. Therefore, the adopted directional terms are for describing and understanding the present invention better and more clearly, not for indicating or implying the device or component having specific direction or operating by using a specific directional structure. Therefore, cannot be understood as the limitation of the present invention.

In the description of the present invention, it should be noted that unless additional definite rule and limitation are provided, the term "install", "link", "connect" should be understood broadly. For example, can be fixedly connected or detachably connected or integrally connected; or mechanically connected, directly connected, indirectly connected through an intermediate or internal communication between two components. For the person of ordinary skill in the art, the specific meaning of the present invention of the above terms can be understood based on specific situation.

Besides, in the description of the present invention, unless additional illustration, "multiple" means two or two above. If a term "process" is appeared in the description of the present invention, the term "process" does not only indicate an independent process, when the process cannot be distinguished from other processes, the expected functions that can be achieved by the process should also be included in that term. Besides, in the description of the present invention, a numerical range adopting "~" means that a value before "~" and a value after "~" are respectively a minimum value and maximum value, and including the minimum value and the maximum value. In the figures, a same numeral in the entire specification and figures represents a same or similar structure.

Figure 1:
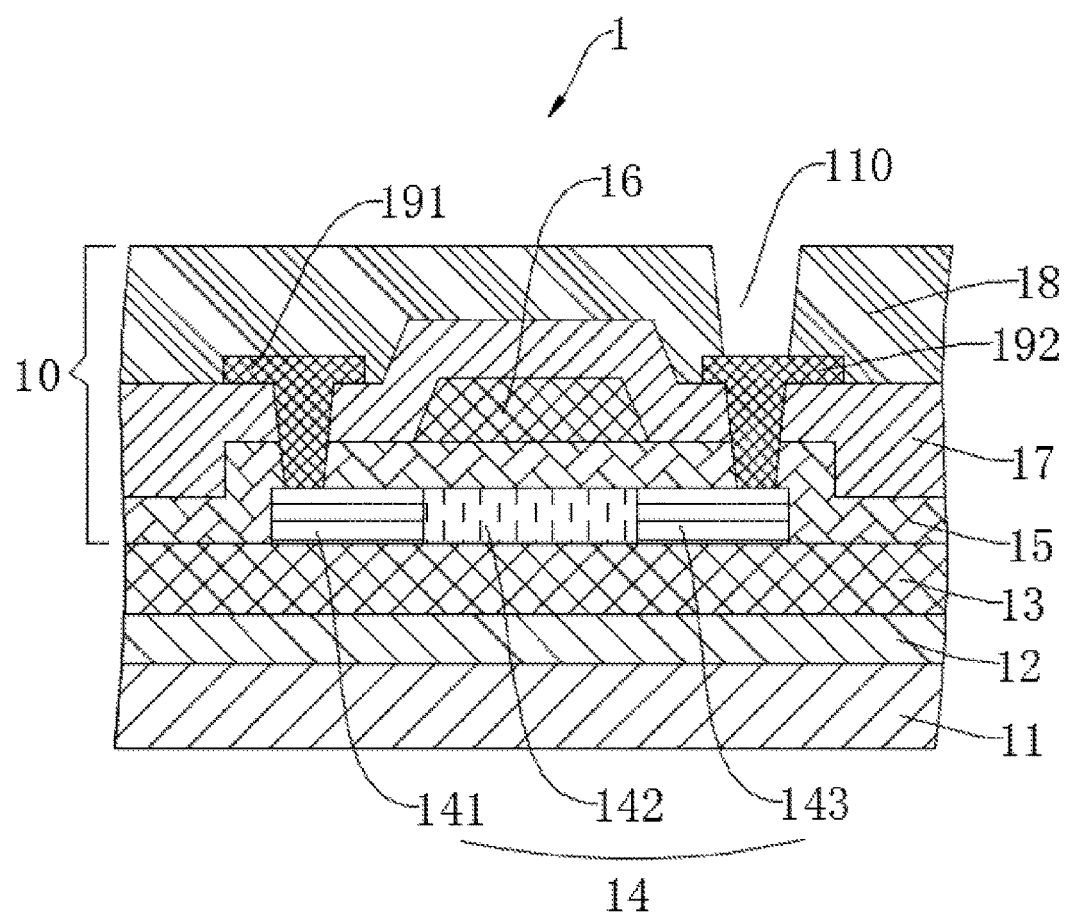
FIG. 1 is a schematic diagram of an array substrate provided by an embodiment of the present invention.

With reference to FIG. 1, the embodiment of the present invention provides an array substrate 1, including a substrate 11, an isolation layer 12 and a buffering layer 13 which are stacked sequentially. Wherein, the substrate 11 is made of an organic material. The isolation layer is made of a metal material, and formed on the substrate 11. The buffering layer 13 is formed at a side of the isolation layer 12 away from the substrate 11.

In the present embodiment, because in the array substrate 1, the isolation layer 12 is disposed between the array substrate 11 and the buffering layer 13, and the isolation layer 12 adopts a metal material, in the process of manufacturing the buffering layer 13 through a high-temperature Plasma Enhanced Chemical Vapor Deposition (PECVD), the isolation layer 12 can prevent an organic material generated by the substrate 11 when the plasma bombard the substrate 11 directly from polluting the cavity and pipe of the device. At the same time, in a subsequent high temperature process such as an excimer laser crystallization process, the isolation layer 12 can also decrease a heat conduction from an external environment to the substrate 11 so as to protect the substrate 11.

It can be understood that the external environment means an outside of the substrate 11, that is, the isolation layer 12 can decrease the heat conducting from the outside of the substrate 11 to an inside of the substrate 11.

Furthermore, with reference to FIG. 1, the array substrate 1 further includes multiple thin-film transistors (TFT) 10. The multiple thin-film transistors 10 are formed at a side of the buffering layer 13 back to the isolation layer 12. The multiple thin-film transistors 10 are arranged on the buffering layer 13 as a matrix.

Furthermore, with reference to FIG. 1, each of the multiple thin-film transistors 10 includes a low-temperature polysilicon layer 14. That is, an active layer of the thin-film transistors 10 is manufactured by a Low temperature polysilicon (LPTS) technology. The LTPS technology includes an Eximer laser annealing (ELA) process. In the ELA process, the isolation layer 12 can effectively decrease the heat conduction from the external environment to the substrate 11 in order to protect the substrate 11.

Furthermore, as a preferably embodiment, the isolation layer 12 can adopt a titanium (Ti) material. Because the titanium material has features of a good toughness, corrosion resistance, high melting point, low thermal conductivity, small stress under extreme cold or hot conditions, and obtaining by a Physical Vapor Deposition (PVD) under a low temperature condition, the isolation layer 12 can protect the substrate 11 better. Especially, because the toughness of the titanium material is good, the isolation layer 12 has a good ability to resist a plasma bombardment. In the formation process of the buffering layer 13, the isolation layer 12 can well protect the substrate 11. Meanwhile, because the thermal conductivity of the titanium material is low, in the ELA process, the isolation layer 12 can effectively decrease the heat conduction from the external environment to the substrate 11 in order to protect the substrate 11.

Furthermore, as another preferred embodiment, the isolation layer 12 can also adopt an aluminum (Al) material, a copper (Cu) material, or a nickel material (Ni) material. In the ELA process, the isolation layer 12 of the present embodiment can absorb a lot of heat so as to effectively decrease the heat conduction from the external environment to the substrate 11 in order to protect the substrate 11.

Furthermore, with reference to FIG. 1, optionally, each of the multiple thin-film transistors further includes a gate insulation layer 15, a gate electrode 16, a dielectric layer 17, a source region 192, a drain region 191 and a planarization layer 18. Specifically, the gate insulation layer 15 covers the low-temperature polysilicon layer 14 and the buffering layer 13. The low-temperature polysilicon layer 14 is treated with a P-type doping and a channel doping in order to form a first portion 141, a second portion 142 and a third portion 143 connected sequentially.

The gate electrode 16 is formed at a side of the gate insulation layer 15 back to the low-temperature polysilicon layer 14, and the gate electrode 16 is right opposite to the second portion 142. The dielectric layer 17 covers the gate electrode 16 and the gate insulation layer 15. The gate insulation layer 15 and the dielectric layer 17 commonly provides with a first hole and a second hole. The first hole is used for revealing the first portion 141, and the second hole 142 is used for revealing the third portion 143. The drain region 191 and the source region 192 are both formed on a surface of the dielectric layer 17 back to the gate insulation layer 15. The drain region 191 is connected with the first portion 141 through the first hole, and the source region 192 is connected with the third portion 143 through the second hole. The planarization layer 18 is provided with a third hole 110. The third hole 110 is used for revealing a portion of the source region 192 such that the source region 192 can be connected with other parts.

Furthermore, the buffering layer 13 includes an oxide material (such as silicon oxide, SiOx) or/and a nitride material (such as silicon nitride, SiNx). Preferably, the buffering layer 13 includes a first sub-buffering layer and a second sub-buffering layer which are stacked. The first sub-buffering layer is adjacent to the isolation layer comparing to the second sub-buffering layer. The first sub-buffering layer is a silicon nitride material, and the second sub-buffering layer is a silicon oxide material. The deposition of the first sub-buffering layer and the second sub-buffering layer can better buffer a damage of the substrate 11 in the manufacturing process of the array substrate 1. Besides, the first sub-buffering layer adopts the silicon nitride material, when manufacturing the silicon nitride material, hydrogen element is generated to repair the low-temperature polysilicon layer 14 in order to increase the electric performance of the low-temperature polysilicon layer 14. The second sub-buffer layer adopts the silicon oxide material used for improving the stress of the second sub-buffering layer in order to prevent the second sub-buffering layer from shedding.

Furthermore, the organic material is Polyimide (PI). Of course, the substrate 11 can also adopt other organic materials (a material formed by elements of carbon, hydrogen, oxygen, nitrogen, etc. is called as an organic material). Preferably, a flexible material is selected such that the substrate 11 is a flexible substrate.

Figure 2:
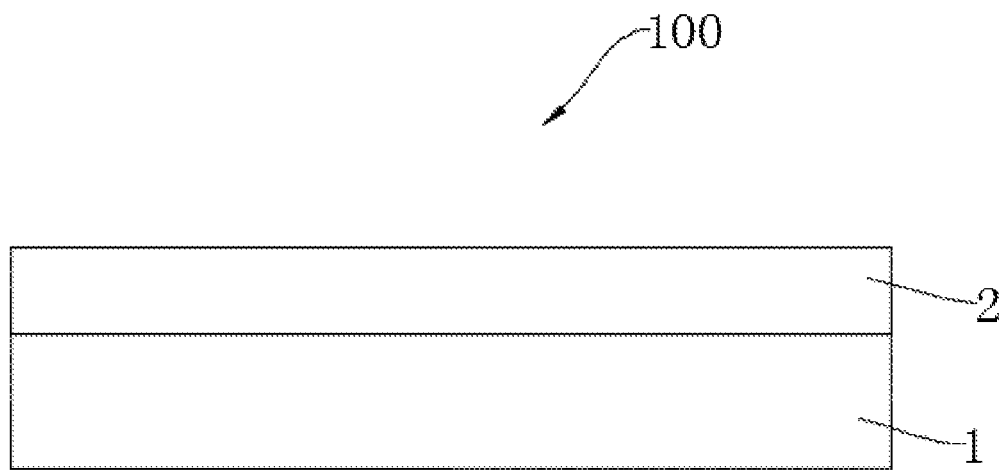
FIG. 2 is a schematic diagram of a display device provided by an embodiment of the present invention.
Figure 3:
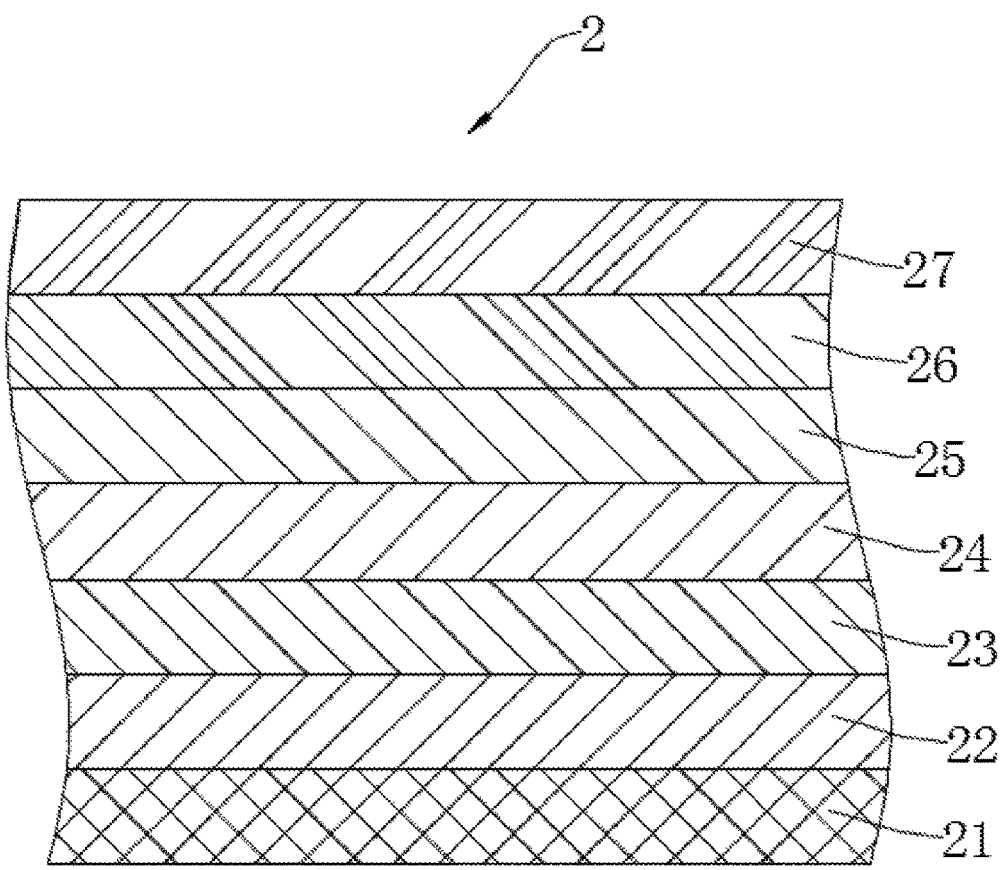
FIG. 3 is a schematic diagram of an organic light emitting diode provided by an embodiment of the present invention.

With reference to FIG. 1 to FIG. 3, the embodiment of the present invention also provides a display device 100. The display device 100 includes an organic light emitting diode 2 and the array substrate described in anyone of the above embodiments. That is, the display device 100 is an organic light emitting display device. The organic light emitting diode 2 is formed on a side of the buffering layer 13 back to the isolation layer 12. Specifically, the organic light emitting diode 2 is formed at a side of the multiple thin-film transistors 10 back to the buffering layer 13. Especially, when the substrate 11 of the array substrate 1 adopts the flexible material the display device 100 is a flexible display device.

In the present embodiment, because the array substrate 1 adopted by the display device 100 includes the isolation layer 12, the isolation layer 12 is disposed between the substrate 11 and the buffering layer 13, and the isolation layer 12 adopts a metal material so that in the process of forming the buffering layer 13 through a high-temperature Plasma Enhanced Chemical Vapor Deposition (PECVD), the isolation layer 12 can prevent an organic material generated by the substrate 11 when the plasma bombard the substrate 11 directly from polluting the cavity and pipe of the device. At the same time, the isolation layer 12 can also decrease a heat conduction from the external environment to the substrate 11 so as to protect the substrate 11. Furthermore, the isolation layer 12 has certain conductivity so that isolation layer 12 has an electrostatic shielding function in order to increase an antistatic interference ability of the display device 100.

Preferably, the isolation layer 12 adopts a titanium material, an aluminum material, a copper material or a nickel material.

Furthermore, with reference to FIG. 1 to FIG. 3, as a preferred embodiment, the organic light emitting diode 2 includes an anode 21, a light-emitting layer 24 and a cathode 27. The light-emitting layer 24 is located between the anode 21 and the cathode 27. The anode 21 adopts a transparent electrode, the cathode 27 adopts a transparent electrode or a semi-transparent electrode. Because the isolation layer 12 adopts a metal material such as titanium that has a low light transmittance, the isolation layer 12 can be a reflective layer for the organic light emitting diode 2.

In the present embodiment, when the cathode 27 adopts the transparent electrode, the isolation layer 12 reflects the light emitted from the light-emitting layer 24, the organic light emitting diode 2 realize a top emitting. Because both the anode 21 and the cathode 27 adopt transparent electrodes, a same material can be adopted, the production cost of the organic light emitting diode 2 can be reduced, and also reduced the production cost of the display device 100.

When the cathode 27 adopts a semi-transparent electrode, the isolation layer 12 and the semi-transparent cathode 27 form a resonant micro-cavity so as to increase a total optical path of the micro-cavity, avoid an over-reliance on the organic film layer (such as the organic light-emitting layer 24) when adjusting the micro-cavity in order to increase an adjustable performance of the organic light emitting diode 2 such that the organic light emitting diode 2 can has a higher luminous efficiency. Accordingly, the display device 100 has a better display effect and low power consumption.

Furthermore, the transparent electrode can adopt an indium tin oxide (ITO) material in order to decrease the cost of the organic light emitting diode 2, and the manufacturing cost of the display device 100. Meanwhile, when the anode 21 adopts the indium tin oxide, a hole injection ability can be increased, an injection energy barrier can be decreased. It can be understood that in another embodiment, the anode 21 can also select another transparent conductive material having a high work function.

Furthermore, the cathode 27 can adopt an Mg/Ag alloy to manufacture the semi-transparent electrode. Wherein, a ratio of Mg to Ag is 1:9. It can be understood that the cathode 27 can also select another semi-transparent conductive material having a low work function.

Furthermore, as a preferably embodiment, with reference to FIG. 3, the organic light emitting diode 2 further includes a hole inject layer (HIL) 22, a hole transport layer (HTL) 23, an electron transport layer (ETL) 25 and an electron inject layer (EIL) 26, which are used for increasing transmission and balancing of the electrons and the holes in order to increase the luminous efficiency of the organic light emitting diode 2. Wherein, the hole inject layer 22 is formed at a side of the anode 21 facing toward the light-emitting layer 24. The hole transport layer 23 is formed between the hole inject layer 22 and the light-emitting layer 24. The electron transport layer 25 is formed at a side of the light-emitting layer 24 back to the hole transport layer 23. The electron inject layer 26 is formed between the electron transport layer 25 and the cathode 27.

With reference to FIG. 1 to FIG. 3, the embodiment of the present invention also provides a display device 100. The display device 100 includes an organic light emitting diode 2 and the array substrate 1 described in anyone of the above embodiments. That is, the display device 100 is an organic light emitting display device. The organic light emitting diode 2 is formed on a side of the buffering layer 13 back to the isolation layer 12. Specifically, the organic light emitting diode 2 is formed at a side of the multiple thin-film transistors 10 back to the buffering layer 13. Especially, when the substrate 11 of the array substrate 1 adopts the flexible material the display device 100 is a flexible display device.

In the present embodiment, because the array substrate 1 adopted by the display device 100 includes the isolation layer 12, the isolation layer 12 is disposed between the substrate 11 and the buffering layer 13, and the isolation layer 12 adopts a metal material so that in the process of forming the buffering layer 13 through a high-temperature Plasma Enhanced Chemical Vapor Deposition (PECVD), the isolation layer 12 can prevent an organic material generated by the substrate 11 when the plasma bombard the substrate 11 directly from polluting the cavity and pipe of the device. At the same time, the isolation layer 12 can also decrease a heat conduction from the external environment to the substrate 11 so as to protect the substrate 11. Furthermore, the isolation layer 12 has certain conductivity so that isolation layer 12 has an electrostatic shielding function in order to increase an antistatic interference ability of the display device 100.

Preferably, the isolation layer 12 adopts a titanium material, an aluminum material, a copper material or a nickel material.

Furthermore, with reference to FIG. 1 to FIG. 3, as a preferably embodiment, the organic light emitting diode 2 includes an anode 21, a light-emitting layer 24 and a cathode 27. The light-emitting layer 24 is located between the anode 21 and the cathode 27. The anode 21 adopts a transparent electrode, the cathode 27 adopts a transparent electrode or a semi-transparent electrode. Because the isolation layer 12 adopts a metal material such as titanium that has a low light transmittance, the isolation layer 12 can be a reflective layer for the organic light emitting diode 2.

In the present embodiment, when the cathode 27 adopts the transparent electrode, the isolation layer 12 reflects the light emitted from the light-emitting layer 24, the organic light emitting diode 2 realize a top emitting. Because both the anode 21 and the cathode 27 adopt transparent electrodes, a same material can be adopted, the production cost of the organic light emitting diode 2 can be reduced, and also reduced the production cost of the display device 100.

When the cathode 27 adopts a semi-transparent electrode, the isolation layer 12 and the semi-transparent cathode 27 form a resonant micro-cavity so as to increase a total optical path of the micro-cavity, avoid an over-reliance on the organic film layer (such as the organic light-emitting layer 24) when adjusting the micro-cavity in order to increase an adjustable performance of the organic light emitting diode 2 such that the organic light emitting diode 2 can has a higher luminous efficiency. Accordingly, the display device 100 has a better display effect and low power consumption.

Furthermore, the transparent electrode can adopt an indium tin oxide (ITO) material in order to decrease the cost of the organic light emitting diode 2, and the manufacturing cost of the display device 100. Meanwhile, when the anode 21 adopts the indium tin oxide, a hole injection ability can be increased, an injection energy barrier can be decreased. It can be understood that in another embodiment, the anode 21 can also select another transparent conductive material having a high work function.

Furthermore, the cathode 27 can adopt a Mg/Ag alloy to manufacture the semi-transparent electrode. Wherein, a ratio of Mg to Ag is 1:9. It can be understood that the cathode 27 can also select another semi-transparent conductive material having a low work function.

Furthermore, as a preferably embodiment, with reference to FIG. 3, the organic light emitting diode 2 further includes a hole inject layer (HIL) 22, a hole transport layer (HTL) 23, an electron transport layer (ETL) 25 and an electron inject layer (EIL) 26, which are used for increasing transmission and balancing of the electrons and the holes in order to increase the luminous efficiency of the organic light emitting diode 2. Wherein, the hole inject layer 22 is formed at a side of the anode 21 facing toward the light-emitting layer 24. The hole transport layer 23 is formed between the hole inject layer 22 and the light-emitting layer 24. The electron transport layer 25 is formed at a side of the light-emitting layer 24 back to the hole transport layer 23. The electron inject layer 26 is formed between the electron transport layer 25 and the cathode 27.

With reference to FIG. 1 to FIG. 3, in the present embodiment, the anode 21 can connect with the source region 192 through the third hole 110 for realizing an electrical connection between the organic light emitting diode 2 and the array substrate 1.

With reference to FIG. 1, the present invention also provides a manufacturing method for an array substrate 1, used for manufacturing the array substrate 1 of the above embodiment, the manufacturing method includes:

Step 1: providing a substrate 11, and the substrate 11 adopts an organic material;

Step 2: forming an isolation layer 12 on the substrate 11, and the isolation layer adopts a metal material;

Step 3: forming a buffering layer 13 at a side of the isolation layer 12 back to the substrate 11; and Step 4: forming multiple thin-film transistors 10 on a side of the buffering layer 13 back to the isolation layer 12.

In the present embodiment, because in the substrate 11, the isolation layer 12 is provided, and the isolation layer 12 adopts a metal material, in the process of manufacturing the buffering layer 13 through a high-temperature Plasma Enhanced Chemical Vapor Deposition (PECVD), the isolation layer 12 can prevent an organic material generated by the substrate 11 when the plasma bombard the substrate 11 directly from polluting the cavity and pipe of the device. At the same time, the isolation layer 12 can also decrease a heat conduction from the external environment to the substrate 11 so as to protect the substrate 11.

Furthermore, the Step 2 includes: depositing a titanium material on the substrate in order to form the isolation layer 12. Because the Ti material has features of a good toughness, corrosion resistance, high melting point, low thermal conductivity, small stress under extreme cold or hot conditions, and obtaining by a Physical Vapor Deposition (PVD) under a low temperature condition, the isolation layer 12 can protect the substrate 11 better. Especially, the toughness of the Ti material is good, the isolation layer 12 has a good ability to resist a plasma bombardment. In the formation process of the buffering layer 13, the isolation layer 12 can well protect the substrate 11. Meanwhile, because the thermal conductivity of the Ti material is low, in the ELA process, the isolation layer 12 can effectively decrease the heat conduction from the external environment to the substrate 11 in order to protect the substrate 11.

Furthermore, the step of depositing a titanium material on the substrate includes: a process temperature for depositing the titanium material on the substrate is less than or equal to 250°. That is, the titanium material can adopt a low-temperature deposition method to perform depositing in order to form the isolation layer 12. The difficulty for forming the isolation layer 12 is lower.

Furthermore, the step of depositing a titanium material on the substrate includes: through a magnetron sputtering to deposit the titanium material on the substrate 11. The magnetron sputtering is one of the Physical Vapor Deposition (PVD). The magnetron sputtering through introducing a magnetic field on a surface on a cathode of a target, and using the magnetic field to restrict the charged particles in order to increase the plasma density in order to increase the sputter rate. In another embodiment, another physical vapor deposition method can be adopted to deposit the titanium material.

Furthermore, the Step 2 includes: depositing an aluminum material, a copper material or a nickel material on the substrate in order to form the isolation layer 12. In the ELA process, the isolation layer 12 of the present embodiment can absorb a lot of heat so as to effectively decrease the heat conduction from the external environment to the substrate 11 in order to protect the substrate 11.

Furthermore, with reference to FIG. 1, the Step 4 includes:

Step 41: forming an amorphous silicon layer on a side of the buffering layer 13 back to the isolation layer 12;

Step 42: through an Eximer laser annealing (ELA) process, transforming the amorphous silicon layer into a polysilicon layer.

Step 43: through a photolithography process for patterning the polysilicon layer;

Step 44: through a P-type doping and a channel doping, the polysilicon layer forms an active layer (that is, the low-temperature polysilicon layer 14) of each of the multiple thin-film transistors 10;

Step 45: sequentially forming a gate insulation layer 15, a gate electrode 16, a dielectric layer 17, a source region 192, a drain region 191 and a planarization layer 18 in order to form the multiple thin-film transistors 10.

In the present embodiment, in the ELA process, the isolation can decrease the heat conduction from the external environment to the substrate 11 in order to protect the substrate 11.

Optionally, before the Step 42 is performed, a pre-cleaning process can be performed for removing hydrogen and excimer laser crystallization to the amorphous silicon layer.

The above embodiment does not constitute a limitation of the scope of protection of the present technology solution. Any modifications, equivalent replacements and improvements based on the spirit and principles of the above embodiments should also be included in the protection scope of the present technology solution.

What is claimed is:

1. An array substrate, comprising:
   a substrate adopting an organic material;
   an isolation layer adopting a metal material selected only from one of a titanium material, an aluminum material, a copper material and a nickel material, and the isolation layer is directly formed on the substrate;
   a buffering layer directly formed at a side of the isolation layer away from the substrate;
   wherein the buffering layer includes an oxide material and/or a nitride material;
   wherein, the array substrate further includes multiple thin-film transistors, the multiple thin-film transistors are formed at a side of the buffering layer back to the isolation layer;
   wherein each of the multiple thin-film transistors includes a low-temperature polysilicon layer, a gate insulation layer, a gate electrode, a dielectric layer, a source region, a drain region and a planarization layer;
   wherein the low-temperature polysilicon layer is directly formed on the buffering layer; and
   wherein the gate insulation layer directly covers the low-temperature polysilicon layer and the buffering layer.

2. A display device, comprising
   a substrate adopting an organic material;
   an isolation layer adopting a metal material selected only from one of a titanium material, an aluminum material, a copper material and a nickel material, and the isolation layer is directly formed on the substrate;
   a buffering layer directly formed at a side of the isolation layer away from the substrate;
   wherein the buffering layer includes an oxide material and/or a nitride material;
   wherein, the array substrate further includes multiple thin-film transistors, the multiple thin-film transistors are formed at a side of the buffering layer back to the isolation layer;
   wherein each of the multiple thin-film transistors includes a low-temperature polysilicon layer, a gate insulation layer, a gate electrode, a dielectric layer, a source region, a drain region and a planarization layer;
   wherein the low-temperature polysilicon layer is directly formed on the buffering layer;
   wherein the gate insulation layer directly covers the low-temperature polysilicon layer and the buffering layer; and
   the organic light emitting diode is formed at a side of the buffering layer back to the isolation layer, and formed directly on the planarization layer.

3. A manufacturing method for an array substrate, comprising:
   providing a substrate, and the substrate adopts an organic material;
   forming an isolation layer on the substrate, and the isolation layer adopts a metal material selected only from one of a titanium material, an aluminum material, a copper material and a nickel material, and the isolation layer is directly formed on the substrate;
   directly forming a buffering layer at a side of the isolation layer back to the substrate; and
   forming multiple thin-film transistors on a side of the buffering layer back to the isolation layer
   wherein the buffering layer includes an oxide material and/or a nitride material;
   wherein each of the multiple thin-film transistors includes a low-temperature polysilicon layer, a gate insulation layer, a gate electrode, a dielectric layer, a source region, a drain region and a planarization layer;
   wherein the low-temperature polysilicon layer is directly formed on the buffering layer; and
   wherein the gate insulation layer directly covers the low-temperature polysilicon layer and the buffering layer.

4. The manufacturing method for an array substrate according to claim 3, wherein, the step of depositing a titanium material on the substrate comprises:
   a process temperature for depositing the titanium material on the substrate is less than or equal to 250°.

5. The manufacturing method for an array substrate according to claim 4, wherein, the step of depositing a titanium material on the substrate comprises:
   through a magnetron sputtering to deposit the titanium material on the substrate.

6. The manufacturing method for an array substrate according to claim 3, wherein, the step of depositing a titanium material on the substrate comprises:
   through a magnetron sputtering to deposit the titanium material on the substrate.

* * * * *